(12) United States Patent
Banu

(10) Patent No.: US 6,313,687 B1
(45) Date of Patent: Nov. 6, 2001

(54) VARIABLE IMPEDANCE CIRCUIT

(75) Inventor: Mihai Banu, Murray Hill, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/675,400

(22) Filed: Sep. 29, 2000

Related U.S. Application Data

(60) Provisional application No. 60/225,900, filed on Aug. 17, 1960, and provisional application No. 60/229,393, filed on Aug. 28, 2000.

(51) Int. Cl.[7] .................................................. H03K 5/08
(52) U.S. Cl. ........................ 327/317; 327/362; 327/552
(58) Field of Search ................................. 327/317, 362, 327/341, 346, 560–563, 551, 552

(56) References Cited

U.S. PATENT DOCUMENTS

| | | | |
|---|---|---|---|
| 3,937,944 | * | 2/1976 | Radzyner et al. ................ 327/100 |
| 4,509,019 | | 4/1985 | Banu ................................... 330/107 |
| 4,749,957 | | 6/1988 | Tsividis .............................. 330/253 |
| 5,227,736 | * | 7/1993 | Tucker et al. ...................... 327/100 |
| 6,118,322 | * | 9/2000 | Bockelman et al. .............. 327/317 |
| 6,144,706 | * | 11/2000 | Sato et al. ........................... 327/317 |

OTHER PUBLICATIONS

Banu, M. et al., "Fully Integrated Active RC Filters in MOS Technology", IEEE Journal of Solid–State Circuits, vol. SC–18, No. 6, pp. 644–651, Dec. 1983.

Banu, M. et al., "A MOSFET–R–C Filtering Technique With Improved Linearity", Proceedings of the European Conference on Circuit Theory and Design ECCTD '99, Stresa, Italy, pp. 1–4, Aug. 29–Sep. 2, 1999.

* cited by examiner

*Primary Examiner*—Toan Tran
(74) *Attorney, Agent, or Firm*—Ozer M. N. Teitelbaum

(57) ABSTRACT

A variable impedance circuit for use with a load, such as an IC-based active filter circuit, formed on a semiconductor substrate. The variable impedance circuit includes at least one non-linear element, such as a MOSFET. The variable impedance circuit also includes a means for suppressing at least a second order harmonic distortion term from the non-linear element.

18 Claims, 4 Drawing Sheets

VARIABLE IMPEDANCE CIRCUIT

PRIORITY APPLICATION

This application claims priority from provisional U.S. patent application, Serial No. 60/225,900, filed on Aug. 17, 2000, and provisional U.S. patent application, Serial No. 60/229,393, filed on Aug. 28, 2000, both of which are hereby incorporated by reference.

FIELD OF THE INVENTION

The present invention relates to integrated circuits, generally, and more particularly, to a variable impedance circuit.

BACKGROUND OF THE INVENTION

An active filter circuit employs a combination of passive linear elements, such as resistors, inductors and capacitors, with at least one active element, such as an operational amplifier. The selection and arrangement of these elements form the basis of a transfer function for the active filter circuit.

Active filter circuits are often realized as part of an integrated circuit ("IC"). IC fabrication process and temperature variations may result in circuit parameters, such as time constants, for example, which fluctuate from IC to IC. Thus, the transfer function of these IC-based active filter circuits may not be sufficiently predictable for certain applications, including communication networks and control systems, for example.

One approach for increasing the predictability of the transfer function of an IC-based active filter circuit has been to integrate a variable impedance (i.e., a voltage-controlled resistor) within the IC-based active filter circuit. Here, the variable impedance is realized by a field effect transistor ("FET"), such as a metal oxide semiconductor FET ("MOSFET"), operating in a triode region. For the purposes of the present invention, the triode region refers to a region of operation of a FET in which its drain-to-source voltage is less than or equal to the difference between its gate-to-source voltage and a device threshold voltage. This MOSFET-based variable impedance is commonly situated at the input of the IC-based active filter circuit. By this arrangement, the drain of the MOSFET-based variable impedance is positioned to receive an input signal to be filtered, while the source of the MOSFET-based variable impedance is connected to an input of an IC-based active filter circuit. The impedance of the MOSFET-based variable impedance is adjustable in response to a control signal voltage applied between the gate and source of the MOSFET. Consequently, the MOSFET-based variable impedance may be adjusted or tuned to provide the IC-based active filter circuit with a more desirable (i.e., sufficiently more predictable) transfer function.

Ideally, the response characteristics of a MOSFET-based variable impedance would be linear. MOSFETs, however, are non-linear elements. The linearity of the response characteristics of a MOSFET operating within the triode region increases in response to an increase in the gate-to-source voltage. The response characteristics of a MOSFET-based variable impedance have been expressed using a Taylor power expansion series. This Taylor expansion series includes a linear first order term and non-linear even and odd order terms, thereafter. For the purposes of the present invention, the non-linear terms of the Taylor expansion are referred to as harmonic distortion.

For a MOSFET operating in the triode region, the second order term is the most significant non-linear term in the Taylor expansion series. Various alternatives have been proposed for the reducing the effect of the second order harmonic distortion term on the response characteristics of a MOSFET-based variable impedance. One advantageous and often commercially implemented approach, commonly referred to as the MOSFET-C integrator, proposes canceling the second order harmonic distortion term from the response characteristics of the MOSFET-based variable impedance to thereby increase its linearity. For example, see U.S. Pat. No. 4,509,019, issued on Apr. 2, 1985 to Banu et al. This solution performs this cancellation by employing a pair of substantially identical MOSFETs having a common gate. Each MOSFET is configured to operate in the triode region and function as a variable impedance (i.e., adjustable in response to a control signal voltage). More particularly, the drain of one MOSFET of the pair is designed to receive an input signal, while the drain of the other MOSFET is designed to receive a complement of the input signal. Similarly, a source of the first MOSFET is coupled with an input to an IC-based active filter circuit, while the source of the second MOSFET is coupled with a complementary input of the IC-based active filter circuit. In the response to the reception of an input signal and its complement, one MOSFET generates a second order term, which is equal in magnitude and opposite in sign with the second order term generated by the other MOSFET. Consequently, these second order terms are summed as they are input into the IC-based active filter circuit, thereby canceling each otherout.

SUMMARY OF THE INVENTION

We have recognized that canceling the second order harmonic distortion term is becoming increasingly less effective as ICs continue to be reduced in size. With the scaling down in size of ICs, power supply voltage requirements continue to be reduced. As such, the maximum operative gate-to-source and threshold voltages for a MOSFET continue to be reduced along with the range of its triode region. Thus, we have recognized that the method of canceling the second order harmonic distortion term will become increasingly prone to harmonic distortion as ICs are further scaled down in size. This recognition is based on the relationship between the gate-to-source voltage of a MOSFET and the degree of linearity of the response characteristics of the MOSFET-based variable impedance (i.e., the greater the gate-to-source voltage, the more linear the impedance of a MOSFET operating in a triode region). Consequently, we have identified the difficulties in canceling the second order harmonic distortion term as the triode region of operation region diminishes with the continued scaling down in size of ICs.

Our invention solves these problems by providing a variable impedance circuit in which at least the second order harmonic distortion term is suppressed. For the purposes of the present disclosure, suppressing a harmonic distortion term means substantially not creating the harmonic distortion term, in contradistinction to prior approach in which an undesired harmonic distortion term is first created and, thereafter cancelled.

BRIEF DESCRIPTION OF THE DRAWINGS

The present invention will be better understood from reading the following description of non-limiting embodiments, with reference to the attached drawings, wherein below:

FIG. 1(*a*) illustrates a first embodiment of the present invention, FIG. 1(*b*) illustrates an element which may advantageously be employed in the first embodiment, while

DETAILED DESCRIPTION OF THE PRESENT INVENTION

Figure 1A:
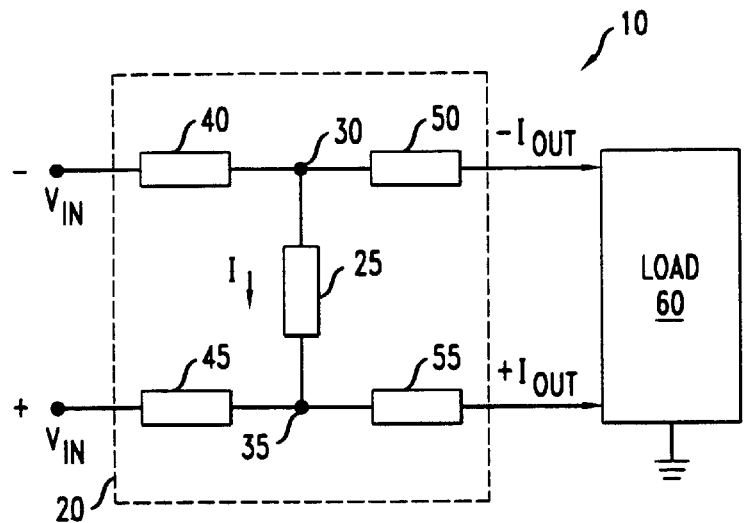
Figure 1B:
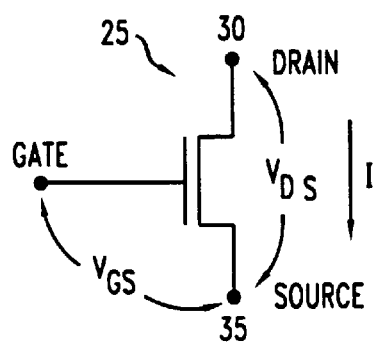
Figure 1C:
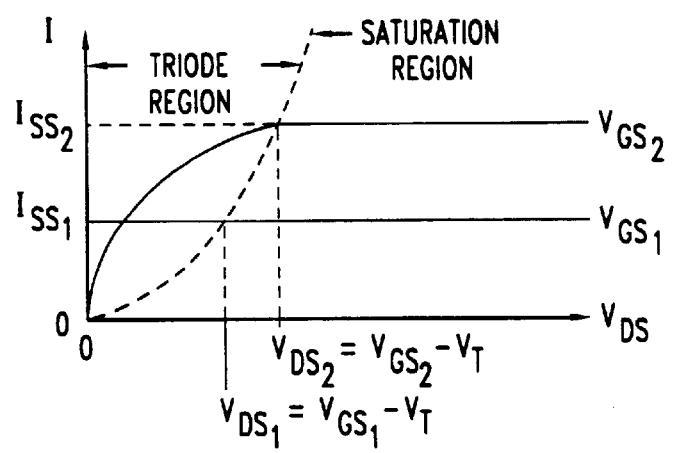
FIG. 1(c) illustrates the response characteristics of the element of FIG. 1(b)

Referring to FIGS. 1(a), 1(b) and 1(c), a circuit 10 is illustrated according to a first embodiment of the present invention. Circuit 10 comprises a load 60. Load 60 has a transfer function that may not be sufficiently predictable for certain applications, including communication networks and control systems, for example. To compensate for this lack of predictability, a variable impedance circuit 20 is coupled with load 60. The impedance of variable impedance circuit 20 is adjustable. As such, the impedance of variable impedance circuit 20 may be adjusted such that a desirable transfer function for circuit 10 is obtained.

Variable impedance circuit 20 comprises a non-linear element. This non-linear element is advantageously realized by a FET 25. As shown in FIG. 1(b), FET 25 comprises a gate, a source and a drain. Various substitutes for FET 25, however, having non-linear voltage-current response characteristics will become apparent to skilled artisans upon reviewing the present disclosure.

As shown in FIG. 1(c), FET 25 may be employed as a variable impedance while operating in the triode region—in contrast with a saturation region of operation, where FET 25 may be better suited to function as a current source. To operate in the triode region, the voltage between the drain and source (i.e., the drain-to-source voltage) of FET 25 must be less than or equal to the difference between the voltage between its gate and source (i.e., the gate-to-source voltage) and a threshold voltage. For the purposes of the present invention, the threshold voltage is the minimum voltage applied between the gate and source of FET 25 for it to effectively operate as a transistor. By adjusting the gate-to-source voltage applied to FET 25, the impedance of variable impedance circuit 20 may be adjusted or tuned such that a desirable transfer function for circuit 10 is obtained.

The voltage-current response characteristics of FET 25, as illustrated in FIG. 1(c), can be modeled using a Taylor power expansion series. More particularly, a current, I, flowing between the drain and source of FET 25, can be expressed as follows:

$$I = a_1[V_1-V_2] + a_2[V_1^2-V_2^2] + a_3[V_1^3-V_2^3] + a_4[V_1^4-V_2^4] + \ldots + a_i[V_1^i-V_2^i]$$

where $V_1$ is a voltage applied on the drain of FET 25 at a node 30, $V_2$ is a voltage applied on the source of FET 25 at a node 35, and $a_1, a_2, a_3, a_4 \ldots a_i$ are determinable coefficients dependant on various factors including the applied gate-to-source voltage. The first order term in the above expression, $a_1[V_1-V_2]$, is a linear term, while the subsequent order terms are non-linear. As ICs continue to be scaled to smaller sizes, the second order term in the above expression, $a_2[V_1^2-V_2^2]$, is becoming disproportionately larger than the remaining non-linear terms when FET 25 operates in the triode region.

Having recognized the problems in canceling the second order term as ICs are scaled to smaller sizes, our solution, instead, proposes suppressing this second order term. By suppressing the second order term, the impedance characteristics of variable impedance circuit 20 will have increased linearity over a MOSFET-based variable impedance which cancels the second order term. Consequently, variable impedance circuit 20 comprises means for suppressing at least the second order term, $a_2[V_1^2-V_2^2]$, in the Taylor power series expression of the current I. This means for suppressing may also suppress subsequent even order terms in the above Taylor power series expression, including the fourth order term, $a_4[V_1^4-V_2^4]$, for example.

The means for suppressing at least the second order term, $a_2[V_1^2-V_2^2]$ comprises a means for balancing FET 25. For the purposes of the present invention, the term balancing and its derivatives refer to applying a first and a second voltage (or current), wherein the voltages (or currents) are substantially equal in magnitude and opposite in sign. In response to receiving a first and a second voltage input, $(+)V_{IN}$ and $(-)V_{IN}$, the means for balancing FET 25 provides a first voltage, $V_1$, to the drain of FET 25 at node 30 and a second voltage, $V_2$, to the source of FET 25 at node 35. The first and second voltages, $V_1$, and $V_2$, are substantially equal in magnitude and opposite in sign with one another.

The means for balancing FET 25 is realized by a linear network having a first pair of linear elements, 40 and 45, and a second pair of linear elements, 50 and 55. Each pair of linear elements, 40 and 45, and 50 and 55, may be realized by various elements having linear voltage-current response characteristics, including resistors, for example. To balance FET 25, the response characteristics of the linear elements of each pair are substantially identical. Consequently, if each linear element of both pairs are resistors, then the resistance and tolerance of linear element 40 is substantially identical to linear element 45, while the resistance and tolerance of linear element 50 is substantially identical to linear element 55.

As both input voltages, $(+)V_{IN}$ and $(-)V_{IN}$, are equal in magnitude and opposite in sign, and the resistance and tolerance of both pair of linear elements, 40 and 45, and 50 and 55, are substantially identical, the voltage drop across linear element, 40, will be equal and opposite to the voltage drop across linear element and 45. Consequently, the voltage at node 30 will be equal and opposite to the voltage at node 35.

By the configuration of variable impedance circuit 20, FET 25 has a voltage at its drain that is equal in magnitude and opposite in sign with the voltage applied to the source of FET 25 (i.e., $V_1$ is equal to $(-)V_2$). Consequently, by balancing FET 25 at nodes 30 and 35, the hereinabove Taylor power series expression may be restated as follows: if, $V_1=(-)V_2$, then $$I = a_1[V_1-(-V_1)] + a_2[V_1^2-(-V_1)^2] + a_3[V_1^3-(-V_1)^3] + a_4[V_1^4-(-V_1)^4] + \ldots + a_i[V_1^i-(-V_1)^i]$$

or $$I = a[2V_1] + a_3[2V_1^3] + \ldots + a_n[2V_1^n]$$

where n is equal to 2 i−1. From the above mathematical expression, the second order term, as well as subsequent even order harmonic distortion terms, including the fourth order term, are suppressed (i.e., not created).

Variable impedance circuit 20 also functions as a transconductor to load 60. As a transconductor, variable impedance circuit 20 provides a balanced output pair (voltage or current) to load 60 in response to a balanced input pair (current or voltage). In the illustrative embodiment, variable impedance circuit 20 provides a pair of balanced output currents, $(+)I_{OUT}$ and $(-)I_{OUT}$, to load 60 in response to receiving a pair of balanced input voltages, (+)$V_{IN}$ and (−)$V_{IN}$. In the alternative, variable impedance circuit 20 may provide a pair of balanced output voltages, (+)$V_{OUT}$ and (−)$V_{OUT}$, to load 60 in response to receiving a pair of balanced input currents, (+)$I_{IN}$ and (−)$I_{IN}$.

Variable impedance circuit 20 is advantageously employed in conjunction with a load, such as an IC-based active filter circuit or a MOSFET-C integrator. These loads typically may have an odd transfer function, characterized by both a linear response component, as well as a symmetrical non-linear response component. By the configuration of circuit 10, an unpredictable transfer function for load 60 may be compensated for by adjusting the impedance of variable impedance circuit 20, while also suppressing at least the second order harmonic distortion term.

Figure 2:
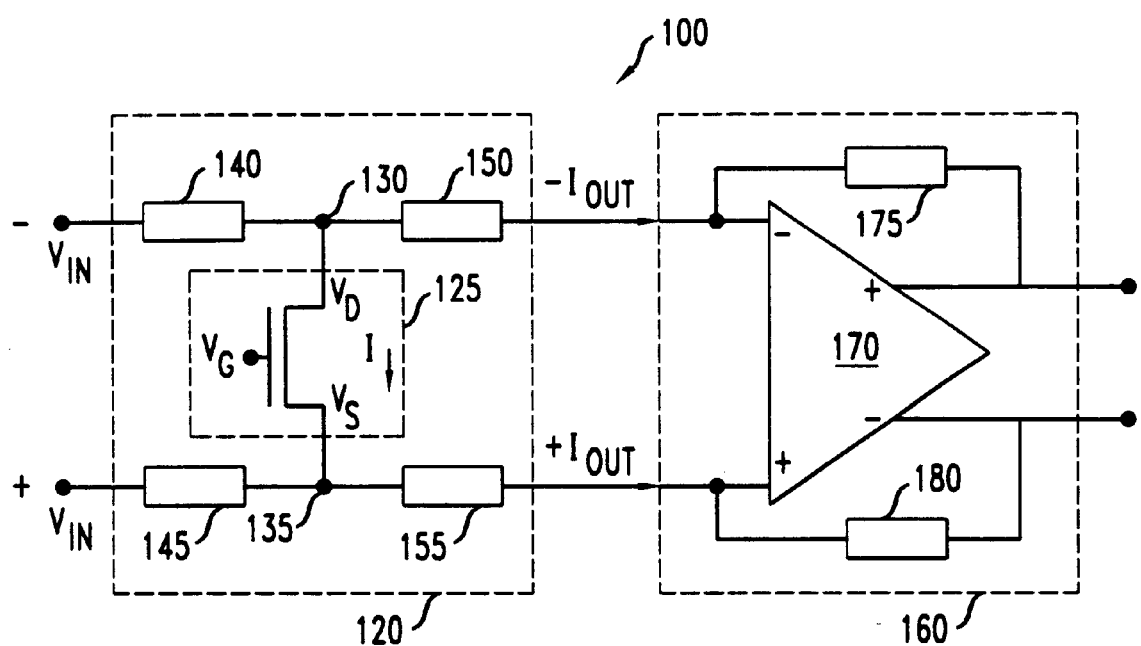
FIG. 2 illustrates a second embodiment of the present invention.

Referring to FIG. 2, an active filter circuit 100 is illustrated according to a second embodiment of the present invention. Active filter circuit 100 operates much like circuit 10 of FIG. 1. However, active filter circuit 100 comprises a variable impedance circuit 120 and an active load 160. Active load 160 comprises a differential amplifier 170, as well as a first and a second linear element, 175 and 180. Active load 160 is topologically symmetrical such that a hypothetical line may be drawn through the center of differential amplifier 170, separating first linear element, 175, from second linear element, 180. This hypothetical line creates an upper half of active load 160 that mirrors (i.e., is equal and opposite to) the lower half of active load 160, wherein first and second linear elements, 175 and 180, are realized by substantially identical components having substantially identical voltage-current response characteristics.

Given its symmetrical topology, active load 160 receives a balanced pair of outputs, (+)$I_{OUT}$ and (−)$I_{OUT}$, from variable impedance circuit 120 in response to variable impedance circuit 120 receiving a balanced pair of inputs, (+)$V_{IN}$ and (−)$V_{IN}$. Variable impedance circuit 120, as such, performs a transconductor function in providing the balanced pair of inputs to active load 160, as well as providing a means for adjusting active circuit 100 to a desirable transfer function. In conjunction with these operative functions, variable impedance circuit 120 also suppresses at least the second order harmonic distortion term in a current I, and, thereby in both balanced inputs, (+)$I_{OUT}$ and (−)$I_{OUT}$, as well.

As in variable impedance circuit 20 of FIG. 1, variable impedance circuit 120 comprises a first pair of linear elements, 140 and 145, coupled with a second pair of linear elements, 150 and 155, at a first and second node, 130 and 135. Coupled between nodes, 130 and 135, is a FET 125 having a gate, drain and a source. Current I flows from the drain to the source of FET 125. FET 125 receives a control signal voltage applied between its gate and source to adjust the impedance of variable impedance circuit 120. Variable impedance circuit 120 receives a balanced pair of voltage signals, (+)$V_{OUT}$ and (−)$V_{OUT}$, and, in response, generates balanced inputs, (+)$I_{OUT}$ and (−)$I_{OUT}$.

Figure 3:
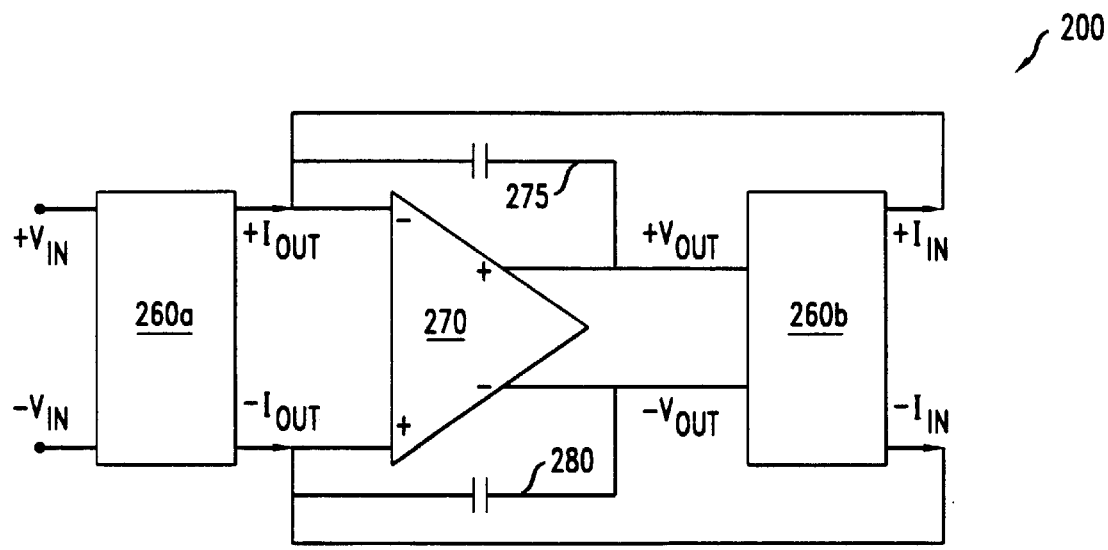
FIG. 3 illustrates a third embodiment of the present invention.

Referring to FIG. 3, a circuit 200 is illustrated according to a third embodiment of the present invention. Circuit 200 operates much like active filter circuit 100 of FIG. 2. Circuit 200, however, comprises a first and a second variable impedance circuit, 260*a* and 260*b*, coupled with a differential amplifier 270 having an input, an output, and a complementary input and a complementary output.

Circuit 200 receives a pair of inputs, (+)$V_{IN}$ and (−)$V_{IN}$, which are equal in magnitude and opposite in sign, through first variable impedance circuit 260*a*. First variable impedance circuit 260*a*, acting as a transconductor, generates a pair of outputs, (+)$I_{OUT}$ and (−)$I_{OUT}$. Outputs, (+)$I_{OUT}$ and (−)$I_{OUT}$, are equal in magnitude and opposite in sign. In conjunction with these functions, first variable impedance circuit 260*a* also suppresses at least the second order harmonic distortion term in the pair of balanced outputs, (+)$I_{OUT}$ and (−)$I_{OUT}$, while providing a variable impedance which may be adjusted in response to a control signal voltage, as stated hereinabove.

Differential amplifier 270 receives the output pair, (+)$I_{OUT}$ and (−)$I_{OUT}$, from first variable impedance circuit 260*a*. Differential amplifier 270 also comprises a feedback path. Within this feedback path is an upper path and a lower path in which a first and second linear element, 275 and 280, as well as a second variable impedance circuit 260*b* are positioned. The upper feedback path couples first linear element 275 and second variable impedance circuit 260*b* between a first output and a first input of differential amplifier 270. Similarly, the lower feedback path couples second linear element 280 and second variable impedance circuit 260*b* between a second output and a second input of differential amplifier 270. While first and second linear feedback elements 275 and 280 are realized by capacitors in the illustrative embodiment, it should be apparent to skilled artisans that various alternative linear elements may also be used to achieve the intended function of circuit 200.

Second variable impedance circuit 260*b* performs a transconductor function. In response to receiving a pair of inputs, (+)$V_{OUT}$ and (−)$V_{OUT}$, which are equal in magnitude and opposite in sign from differential amplifier 270, second variable impedance circuit 260*b* generates a pair of balanced outputs, (+)$I_{IN}$ and (−)$I_{IN}$. The pair of balanced outputs, (+)$I_{IN}$ and (−)$I_{IN}$, as part of the designed feedback path, are fed back into the inputs of differential amplifier 270. Second variable impedance circuit 260*b* also suppresses at least the second order harmonic distortion term in the pair of balanced outputs, (+)$I_{IN}$ and (−)$I_{IN}$. The impedance of second variable impedance circuit 260*b* may be adjusted in response to a control signal voltage, as stated hereinabove. Consequently, second variable impedance circuit 260*b* provides a variable impedance for both upper and lower feedback loops, and, in turn, for differential amplifier 270.

Figure 4:
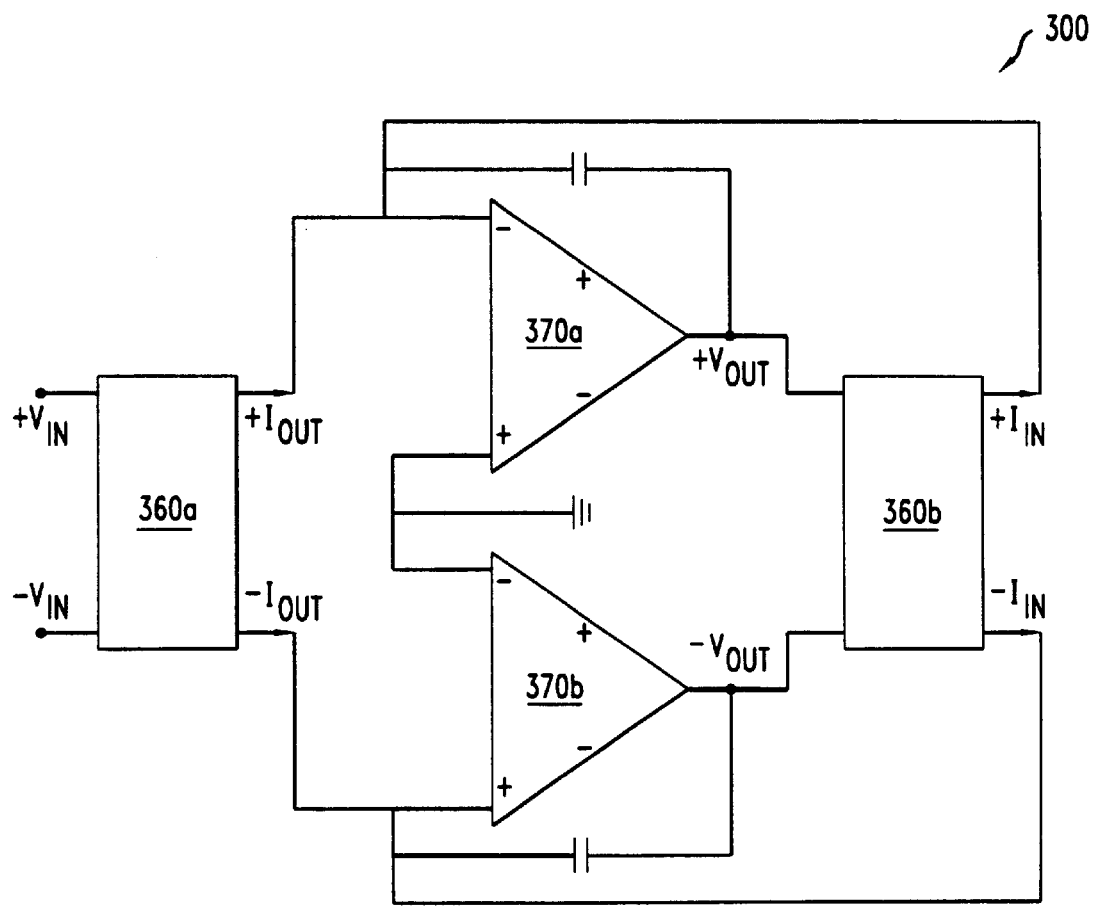
FIG. 4 illustrates a fourth embodiment of the present invention.

Referring to FIG. 4, a circuit 300 is illustrated according to a fourth embodiment of the present invention. Circuit 300 operates much like circuit 200 of FIG. 3. Circuit 300, however, comprises a first and a second differential amplifier, 370*a* and 370*b*.

As in circuit 200 of FIG. 3, circuit 300 comprises a first and second variable impedance circuit, 360*a* and 360*b*, coupled with both first and second differential amplifiers, 370*a* and 370*b*. First and second variable impedance circuits, 360*a* and 360*b*, each perform a transconductor function. First variable impedance circuit, 360*a*, generates a pair of outputs, (+)$I_{OUT}$ and (−)$I_{OUT}$, which are equal in magnitude and opposite in sign, in response to receiving a balanced pair of inputs, (+)$V_{IN}$ and (−)$V_{IN}$. In response to receiving a balanced pair of inputs, (+)$V_{OUT}$ and (−)$V_{OUT}$, from first and second differential amplifiers, 370*a* and 370*b*, second variable impedance circuit, 360*a*, generates a pair of outputs, (+)$I_{IN}$ and (−)$I_{IN}$, which are equal in magnitude and opposite in sign, in a feedback path to each differential amplifier, 370*a* and 370*b*. In conjunction with these functions, first and second variable impedance circuits, 360*a* and 360*b*, also suppress at least the second order harmonic distortion term in their outputs, while providing a variable impedance which may be adjusted in response to a control signal voltage.

In view of the present disclosure, it will become apparent to skilled artisans that circuits 10, 100, 200 and 300 may be utilized in various applications within a larger circuit or network. For example, depending on the values selected for linear elements, a low pass, band pass or high pass filter may be realized. Similarly, an integrator, as well as a variable gain amplifier may also be constructed. With the addition of a number of parallel positioned variable impedance circuits, a summer or summing amplifier may also be realized.

EXAMPLE

In a first experiment, a simulation was run on a computer using a commercially available software application, SPICE. High order low-pass filters using cascaded bi-quad sections have been simulated with SPICE, assuming a standard 0.25 gm CMOS technology and a 2.7 V power supply voltage. Linearity performance comparisons have been made with equivalent structures designed and biased such that both filters had equal frequency responses and tunable ranges.

Figure 5A:
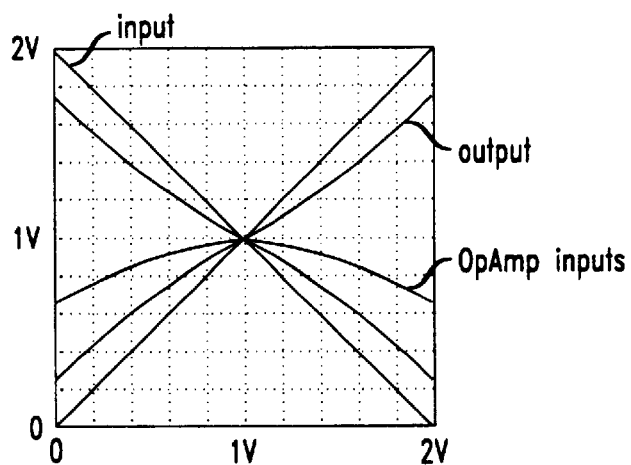
FIG. 5(a), 5(b), and 5(c) illustrate graphical results from a computer simulation of the present invention.
Figure 5B:
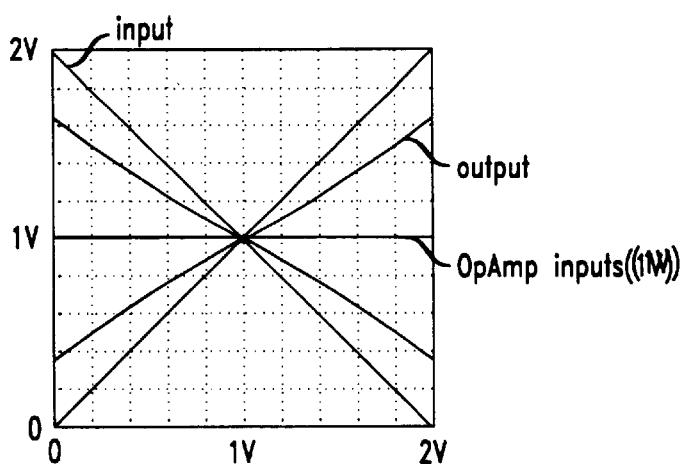
Figure 5C:
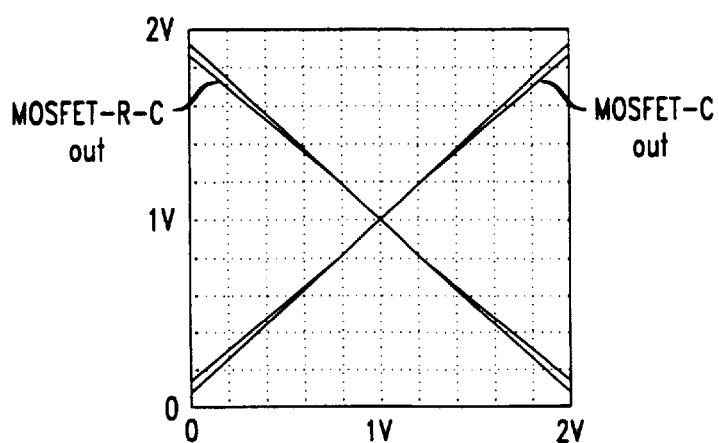

Referring to FIGS. 5(a), 5(b) and 5(c), the characteristics of filters with 250 MHz, −3 dB frequency and 2.5 tunable range, not exceeding 2.7 V on the transistor gates are illustrated. FIG. 5(a) illustrates the pronounced non-linear characteristic of the prior FET circuit approaches for input voltages having an input voltage swing of (+)V to (−)V single-ended (common-mode set at 1 V). The large variation in the operational amplifier input voltage is evident, as is anticipated for FET type design structures. A substantially better characteristic is obtained with an amplifier using the structure of the present invention, as in FIG. 5(b). The difference between the linearity performance of the two designs is further shown in FIG. 5(c).

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Thus, while the circuits of the present invention may be formed on a semiconductor substrate as part of an integrated circuit. It is therefore contemplated that the appended claims will cover any such modifications or embodiments as fall within the true scope of the invention.

What is claimed is:

1. A variable impedance circuit for providing a variable impedance to a load, the variable impedance circuit comprising:
    at least one non-linear element which, in response to an input signal, generates an output signal comprising at least a second order harmonic distortion term; and
    means for suppressing the at least a second order harmonic distortion term.

2. The variable impedance circuit of claim 1, wherein the means for suppressing comprises means for balancing the non-linear element.

3. The variable impedance circuit of claim 2, wherein the means for suppressing further suppresses other order harmonic distortion terms.

4. The variable impedance circuit of claim 2, wherein the means for balancing comprises at least one pair of linear elements, the non-linear element being coupled between each linear element of the pair.

5. The variable impedance circuit of claim 4, wherein the at least one pair of linear elements comprises substantially identical resistors, and the non-linear element comprises a field effect transistor.

6. An integrated circuit comprising:
    a balanced load; and
    a first variable impedance circuit for providing a variable impedance to the balanced load, the first variable impedance circuit comprising:
        at least a first balanced non-linear element which, in response to an input signal, generates an output signal comprising at least a second order harmonic distortion term; and
        a suppressing circuit for suppressing the at least a second order harmonic distortion term.

7. The integrated circuit of claim 6, wherein the suppressing circuit suppresses other order distortion terms.

8. The integrated circuit of claim 6, wherein the balanced load comprises an odd transfer function.

9. The integrated circuit of claim 8, wherein the balanced load comprises an active filter circuit.

10. The integrated circuit of claim 6, wherein the suppressing circuit comprises at least one pair of linear elements, the first balanced non-linear element being coupled between each linear element of the pair.

11. The integrated circuit of claim 10, wherein the at least one pair of linear elements are substantially identical resistors, and the at least one balanced non-linear element comprises a field effect transistor.

12. The integrated circuit of claim 6, wherein the balanced load has a second variable linear impedance within a feedback path, the second variable linear impedance comprising:
    at least a second balanced non-linear element which, in response to a feedback input signal, generates a feedback output signal comprising at least a second order harmonic distortion term; and
    a second suppressing circuit for substantially suppressing the at least a second order harmonic distortion from the feedback output signal.

13. An active filter circuit formed on a semiconductor substrate, the active filter circuit comprising:
    a balanced amplifier; and
    a first variable impedance circuit for providing a first variable impedance to the balanced amplifier, the first variable impedance circuit comprising:
        a first non-linear element which, in response to an input signal, generates an output signal comprising at least a second order harmonic distortion term;
        first means for balancing the first non-linear element; and
        first means for suppressing the at least a second order harmonic distortion term.

14. The active filter circuit of claim 13, wherein the first means for suppressing further suppresses other order distortion terms.

15. The active filter circuit of claim 13, further comprising a second variable impedance circuit within a feedback path of the balanced amplifier, the second variable impedance circuit providing a second variable impedance to the balanced amplifier, the second variable linear impedance circuit comprising:
    a second non-linear element which, in response to a feedback input signal, generates a feedback output signal comprising at least a second order harmonic distortion term;
    second means for balancing the second non-linear element; and
    second means for suppressing the at least a second order harmonic distortion term from the feedback output signal.

16. The active filter circuit of claim 15, wherein at least one of the first and second means for balancing comprises a pair of linear elements.

17. The active filter circuit of claim 16, further comprising a pair of linear feedback elements within the feedback path of the balanced amplifier.

18. The active filter circuit of claim 15, wherein the balanced amplifier comprises a first and a second differential amplifier, each differential amplifier having an input coupled with the first variable linear impedance circuit, and each differential amplifier having an output coupled with the second variable linear impedance circuit.

* * * * *